(12) United States Patent
Sutardja et al.

(10) Patent No.: US 7,709,835 B2
(45) Date of Patent: May 4, 2010

(54) METHOD TO FORM HIGH EFFICIENCY GST CELL USING A DOUBLE HEATER CUT

(75) Inventors: Pantas Sutardja, Los Gatos, CA (US); Albert Wu, Palo Alto, CA (US); Runzi Chang, San Jose, CA (US); Chien-Chuan Wei, Sunnyvale, CA (US); Winston Lee, Palo Alto, CA (US); Peter Lee, Fremont, CA (US)

(73) Assignee: Marvell World Trade Ltd., St. Michael (BB)

(*) Notice: Subject to any disclaimer, the term of this patent is extended or adjusted under 35 U.S.C. 154(b) by 112 days.

(21) Appl. No.: 12/060,792

(22) Filed: Apr. 1, 2008

(65) Prior Publication Data

US 2008/0246015 A1    Oct. 9, 2008

Related U.S. Application Data

(60) Provisional application No. 60/909,813, filed on Apr. 3, 2007.

(51) Int. Cl.
*H01L 29/18* (2006.01)
*H01L 21/00* (2006.01)

(52) U.S. Cl. .......................................... 257/42; 438/95

(58) Field of Classification Search ............... 257/42, 257/515, E27.004; 438/95, 345
See application file for complete search history.

(56) References Cited

U.S. PATENT DOCUMENTS 7,422,926 B2* 9/2008 Pellizzer et al. ............ 438/95

2005/0006681 A1    1/2005  Okuno
2006/0091492 A1*   5/2006  Lee et al. ..................... 257/467
2007/0045606 A1*   3/2007  Magistretti et al. ............. 257/4

FOREIGN PATENT DOCUMENTS

EP    1729355 A    6/2006

OTHER PUBLICATIONS

Ottogalli F. et al.: "Phase-Change Memory Technology for Embedded Applications", Solid-State Device Research Conference, 2004. ESSDERC 2004. Proceedng of the 34th European Leuven, Belguim Sep. 21-23, 2004, Piscataway, NJ, USA, IEEE, US, Sep. 21, 2004, pp. 293-296, XP010738434, ISBN: 978-0-7803-8478-1.

Priovano A. et al.: "µTrench Phase-Change Memory Cell Engineering and Optimization", Solid-State Device Research Conference, 2005. ESSDERC 2005. Proceeding S of 35th European Sep. 12-16, 2005, Piscataway, NJ, USA, IEEE, Sep. 12, 2005, pp. 313-316, XP010858778, ISBN: 987-0-7803-9203-8.

* cited by examiner

*Primary Examiner*—Calvin Lee

(57) ABSTRACT

Embodiments of the present invention provide a method that includes providing wafer including multiple cells, each cell including at least one emitter. The method further includes performing a lithographic operation in a word line direction of the wafer across the cells to form pre-heater element arrangements, performing a lithographic operation in a bit line direction of the wafer across the pre-heater element arrangements to form a pre-heater element adjacent each emitter, and performing a lithographic operation in the word line direction across a portion of the pre-heater elements to form a heater element adjacent each emitter. Other embodiments are also described.

7 Claims, 12 Drawing Sheets

METHOD TO FORM HIGH EFFICIENCY GST CELL USING A DOUBLE HEATER CUT

CROSS-REFERENCE TO RELATED APPLICATIONS

The present application claims priority to U.S. Patent Application No. 60/909,813, filed Apr. 3, 2007, entitled "Method to Form High Efficiency GST Cell with Double Heater Cut," the entire specification of which is hereby incorporated by reference in its entirety for all purposes, except for those sections, if any, that are inconsistent with this specification.

TECHNICAL FIELD

Embodiments of the present invention relate to the field of electronic memory devices, and more particularly, to phase change material (PCM) memory devices and methods for fabricating thereof.

BACKGROUND

Memory cells of electronic memory devices such as dynamic random access memory typically employ a number of electronic components in order to save data. For instance, in order to store data, a combination of electronic components such as transistors, diodes, and/or capacitors are typically employed in such memory cells to store or not store electrical charges. If a charge is stored in such a memory cell, that may indicate a logic "1," and if no charge is stored in such a memory cell that may indicate a logic "0."

An alternative approach for storing data is to use memory cells made of phase change material (PCM). A PCM is a material that can be placed into at least two physical states, a crystalline state and an amorphous state, by increasing or decreasing temperature. By changing the physical state of the PCM, certain characteristics of the material, such as electrical resistance, may also change. Such properties may be exploited in order to form memory cells made of PCM (herein "PCM cells").

Such memory cells are generally intricate and expensive to manufacture. Thus, it is important to manufacture them in such a way to ensure accuracy and reliability such that few memory cells are wasted. One concern involves the contact between a heater element and the PCM. Since it is undesirable to heat up the PCM, it is desirable to have a small contact between the PCM and the heater element.

SUMMARY

In accordance with various embodiments of the present invention, a method includes providing wafer including multiple cells, each cell including at least one emitter. The method further includes performing a lithographic operation in a first direction of the wafer across the cells to form pre-heater element arrangements, performing a lithographic operation in a second direction of the wafer across the pre-heater element arrangements to form a pre-heater element adjacent each emitter, and performing a lithographic operation in the first direction across a portion of each pre-heater elements to form a heater element adjacent each emitter.

In accordance with various embodiments, each heater element may comprise one of titanium nitride (TiN) or tantalum nitride (TaN).

In accordance with various embodiments, the method further includes depositing a heater seal layer adjacent to the heater elements.

In accordance with various embodiments, the method further includes performing a lithographic operation in the second direction to create a micro trench across each cell such that each heater element is exposed.

In accordance with various embodiments, the method further includes depositing germanium antimony tellurium (GST) material within each micro trench.

In accordance with various embodiments, the method further includes forming a top emitter interface on the GST material for at least one emitter.

In accordance with various embodiments, the method further includes performing a metallization such that a metal protective layer is provided on a top surface of at least one top emitter interface. In accordance with such embodiments, the metallization may be performed with tungsten.

In accordance with various embodiments, the first direction is a word line direction and the second direction is a bit line direction.

The present invention also provides an apparatus including a substrate comprising an emitter layer and at least one emitter within the emitter layer, and a heater element adjacent each emitter and having a substantially squared U-shape, wherein a first portion of the U-shape is shorter than a second portion of the U-shape.

In accordance with various embodiments, the first portion is substantially flush with a bottom portion of the substantially squared U-shape.

In accordance with various embodiments, each heater element may comprise one of TiN or TaN.

In accordance with various embodiments, the apparatus further includes a memory cell adjacent the second portion.

In accordance with various embodiments, the apparatus may further include a top emitter interface on the memory cell. In accordance with such embodiments, a top surface of the top emitter interface may comprise tungsten.

In accordance with various embodiments, the memory cell may comprise GST.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

The description may use perspective-based descriptions such as up/down, back/front, and top/bottom. Such descriptions are merely used to facilitate the discussion and are not intended to restrict the application of embodiments of the present invention.

For the purposes of the present invention, the phrase "A/B" means A or B. For the purposes of the present invention, the phrase "A and/or B" means "(A), (B), or (A and B)". For the purposes of the present invention, the phrase "at least one of A, B, and C" means "(A), (B), (C), (A and B), (A and C), (B and C), or (A, B and C)". For the purposes of the present invention, the phrase "(A)B" means "(B) or (AB)" that is, A is an optional element.

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

Embodiments of the present invention provide an ultra high density (UHD) phase change memory (PCM) apparatus and methods for fabricating the same.

Figure 1:
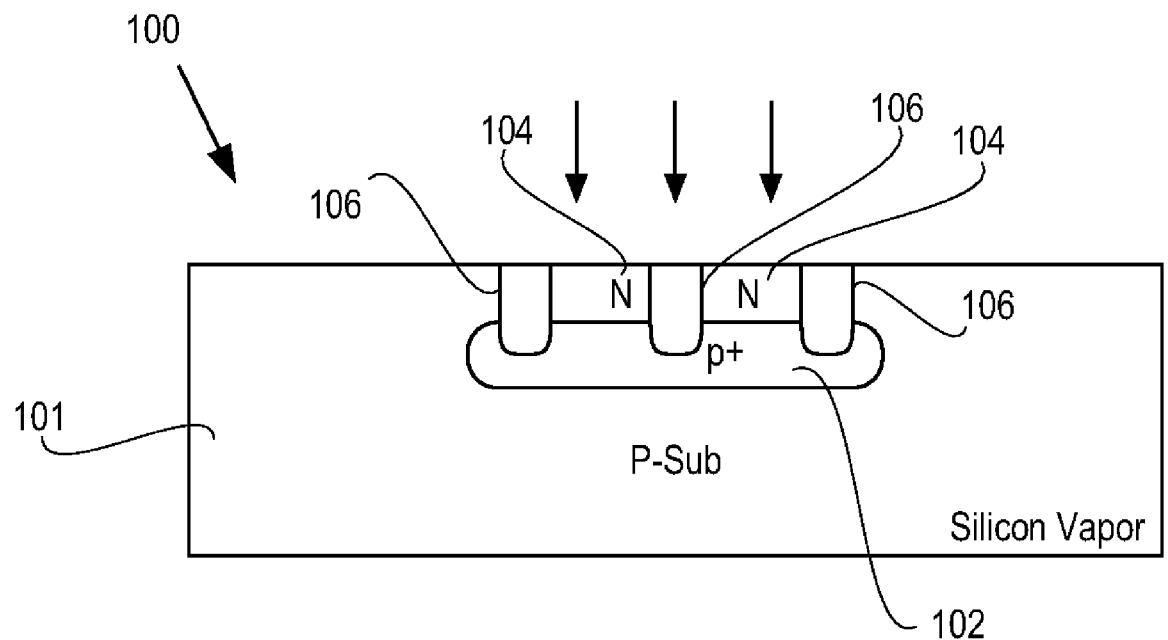
FIGS. 1-2 are cross sectional schematic views of a substrate after various operations, in accordance with various embodiments of the present invention.

Referring to FIG. 1, a memory cell area 100 may be formed beginning with a memory cell area lithograph operation (Clear Tone Mask) that is performed on a silicon vapor substrate 101. A collector doping operation is performed to create a P+ collector region 102, followed by a base doping operation to create an N base region 104. Next, a shallow trench isolation (STI) lithographic operation is performed including etching and filling trenches 106 with oxide. This completes the memory cell area 100 and thus, a chemical mechanical planarization (CMP) operation may be performed to smooth the various areas of the substrate 101.

Figure 2:
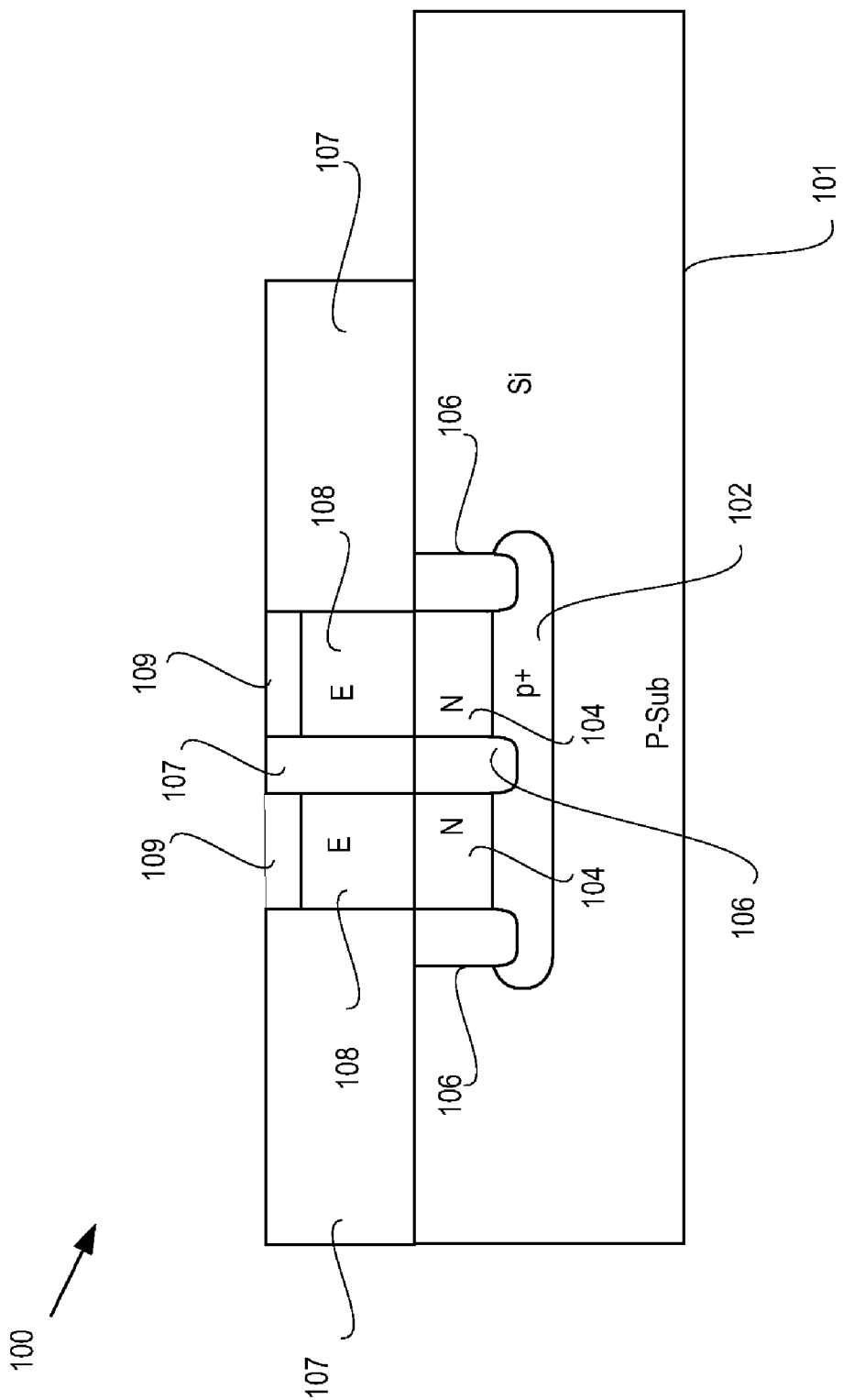

Referring to FIG. 2, an interlayer dielectric deposition (ILD) may then be performed with, for example, oxide, followed by an emitter lithographic formation. The area 100 may then be etched in order to open emitter areas (where the emitters 108 will subsequently be formed) and form ILD regions 107. High temperature silicon germanium (SiGe) is Epi (epitaxial) formed in the emitter areas in order to fill up the emitter areas with P+ SiGe and thereby form the emitters. If needed, a CMP operation may be performed to smooth the surface.

A base lithographic operation may then be performed for memory area opening and ion metal plasma (IMP) is provided to the base 104. It is desirable to insure that the IMP N+ covers the base pick-up. This may be followed by another emitter lithographic operation and IMP to the emitters 108. This is done to help ensure that the base 104 and emitters 108 maintain the proper level of doping after the SiGe Epi formation.

In accordance with various embodiments of the present invention, a silicidation is performed in order to deposit silicide at regions 109. The silicidation may include depositing a layer of, for example, nickel or cobalt. The layer is then etched resulting in regions 109.

Figure 3:
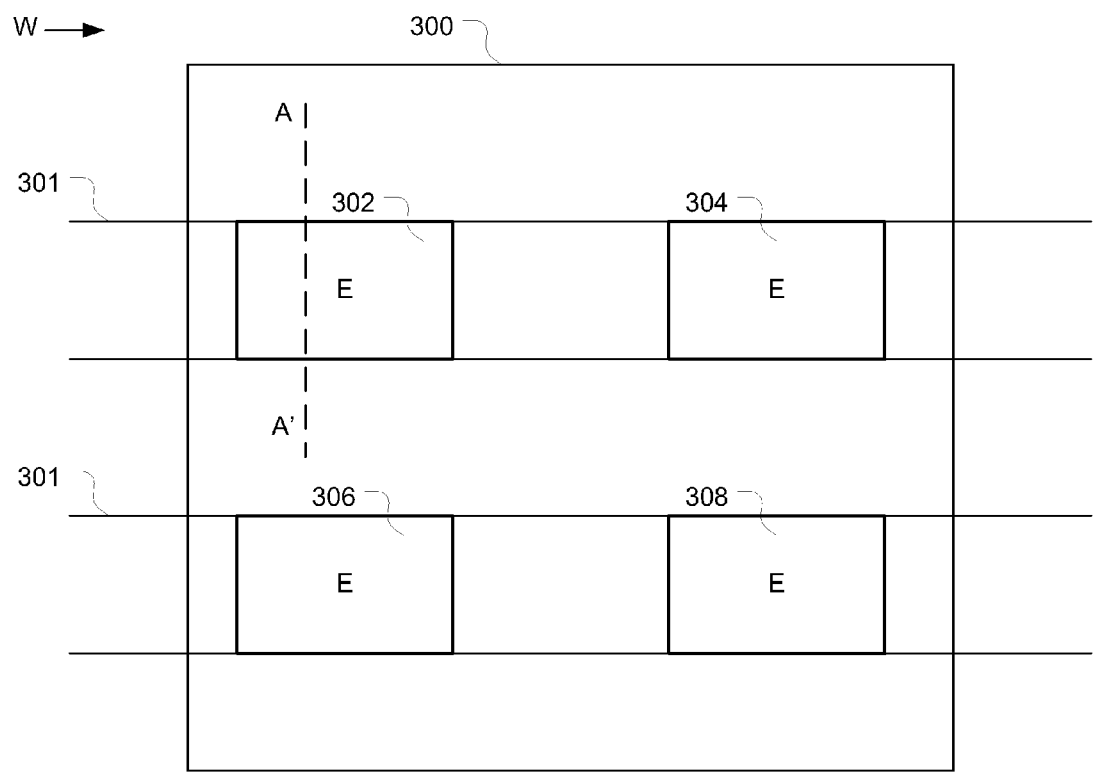
FIG. 3 is a top schematic view of the substrate illustrating a lithographic operation, in accordance with various embodiments of the present invention.
Figure 4:
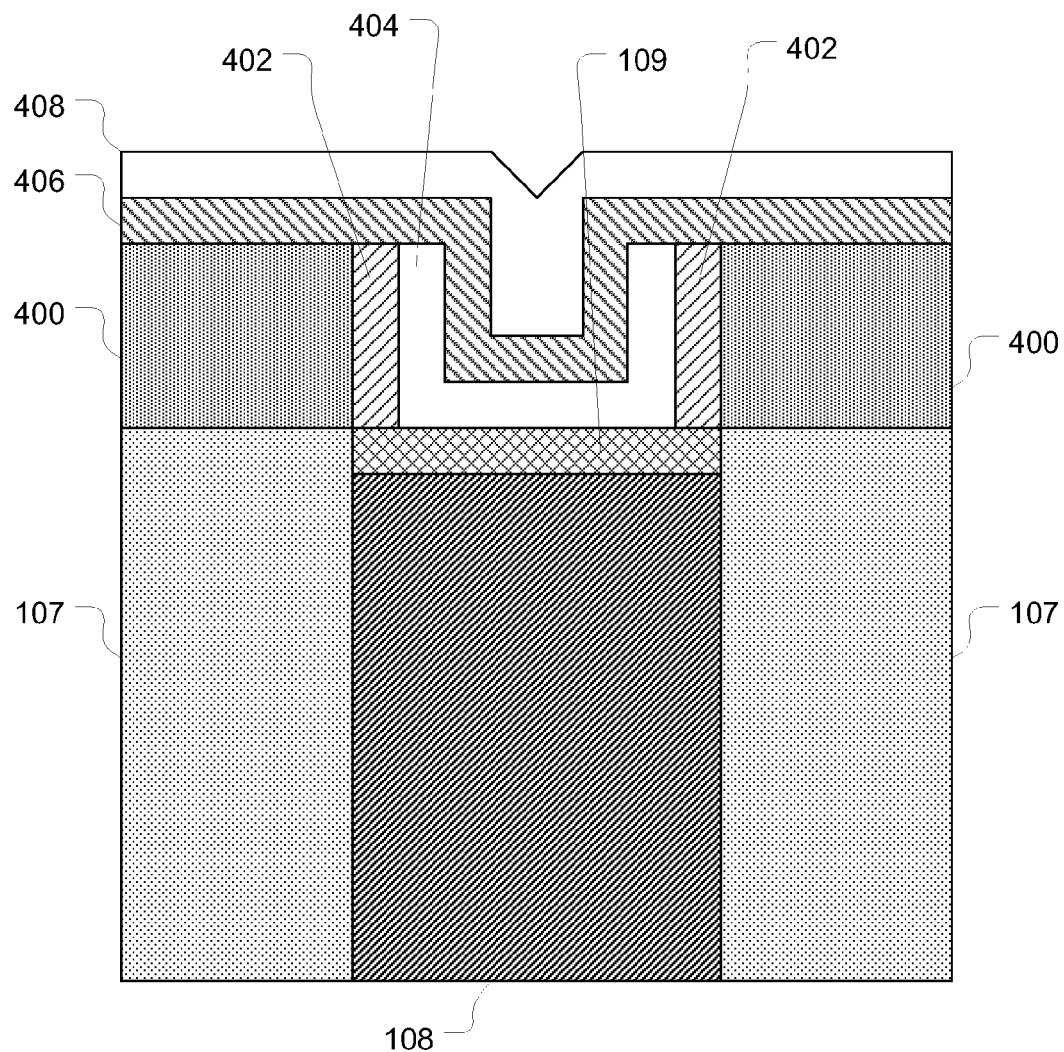
FIG. 4 is cross sectional schematic view of the substrate after the lithographic operation of FIG. 3, as seen along the line A-A' of FIG. 3, in accordance with various embodiments of the present invention.

Referring to FIGS. 3 and 4, in accordance with various embodiments of the present invention, a column trench lithograph operation 301 may then be performed in a word line direction. FIG. 3 schematically illustrates a wafer 300 including multiple cells 100 as previously described. Each cell includes at least one emitter. As an example, four emitters are labeled as 302, 304, 306 and 308. The word line direction is indicated by W. FIG. 4 is a cross sectional view of emitter 302 as seen along the line A-A'.

In accordance with various embodiments, prior to the column trench lithograph operation, a layer of oxide 400 is deposited. The column trench is then etched, stopping at the silicided region 109 of the emitter 108. A thin layer of silicon nitride ($Si_3N_4$) may then be deposited and an anisotropic etch of the $Si_3N_4$ layer is then performed in order to remove a portion of the $Si_3N_4$ layer, but preserve the side wall $Si_3N_4$ in the heater trench in order to provide a heater seal 402.

A heater alloy layer 404, for example, titanium nitride (TiN) or tantalum nitride (TaN) may then be deposited. A thin layer 406 of $Si_3N_4$ is then deposited over the heater alloy layer 404 in order to provide a second heater seal. A layer 408 of oxide is then deposited. Isotropic etching of the $Si_3N_4$ layer 406 may then be performed. A CMP operation may be performed in order to remove oxide until $Si_3N_4$ layer 406 is exposed. The layers 404, 406 and 408 thus form a pre-heater element arrangement. As may be seen in FIG. 4, the heater alloy layer 404 has a substantially squared U shape.

Figure 5:
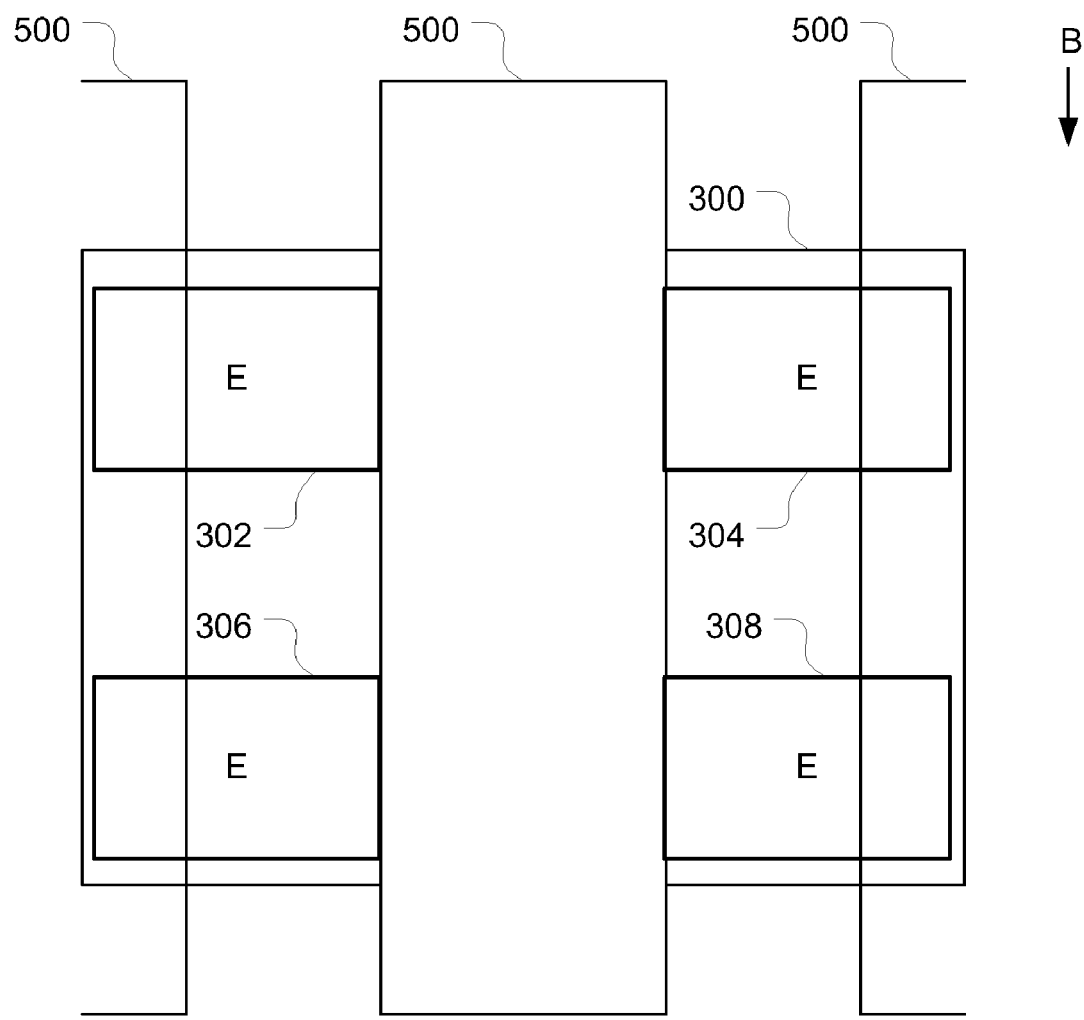
FIGS. 5 and 6 are top schematic views of the substrate illustrating lithographic operations, in accordance with various embodiments of the present invention.

Referring to FIG. 5, a lithographic operation 500 may then be performed in a bit line direction B across the wafer 300. This lithographic operation cuts across cells 100 and the pre-heater element arrangements in the bit line direction to form pre-heater elements. The pre-heater elements still have the same shape and appearance the pre-heater element arrangement of layers 404, 406 and 408 as seen in FIG. 4.

Figure 6:
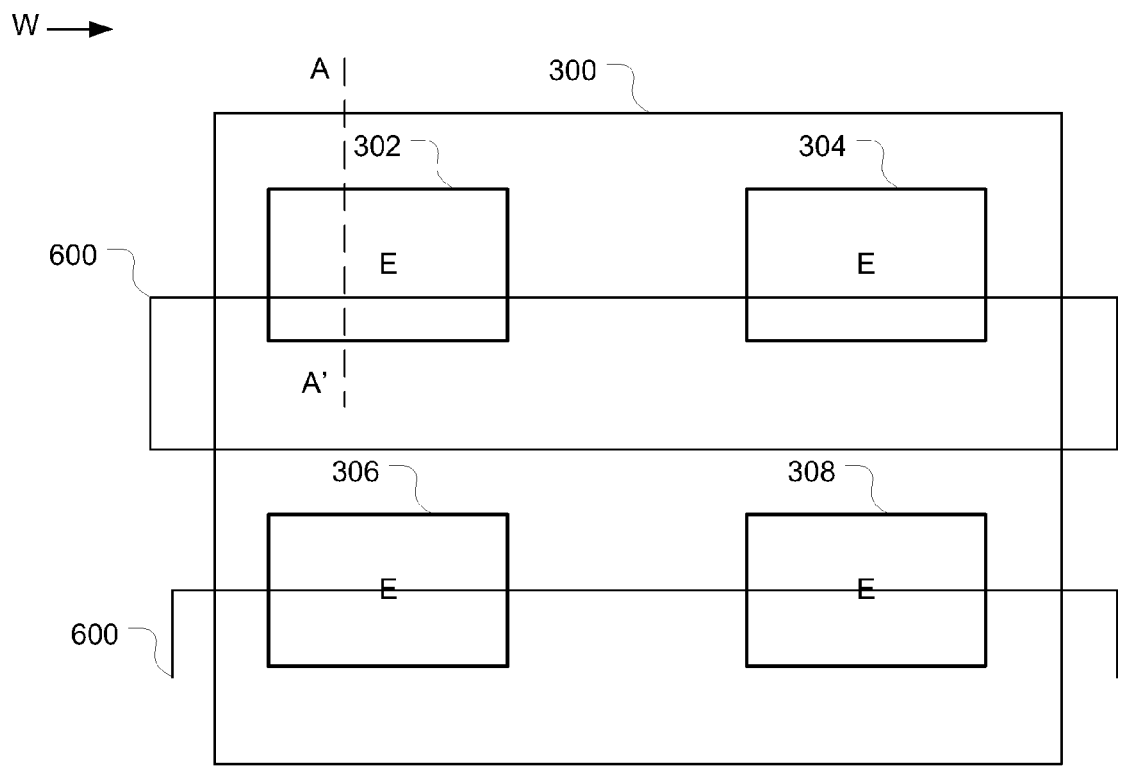
Figure 7:
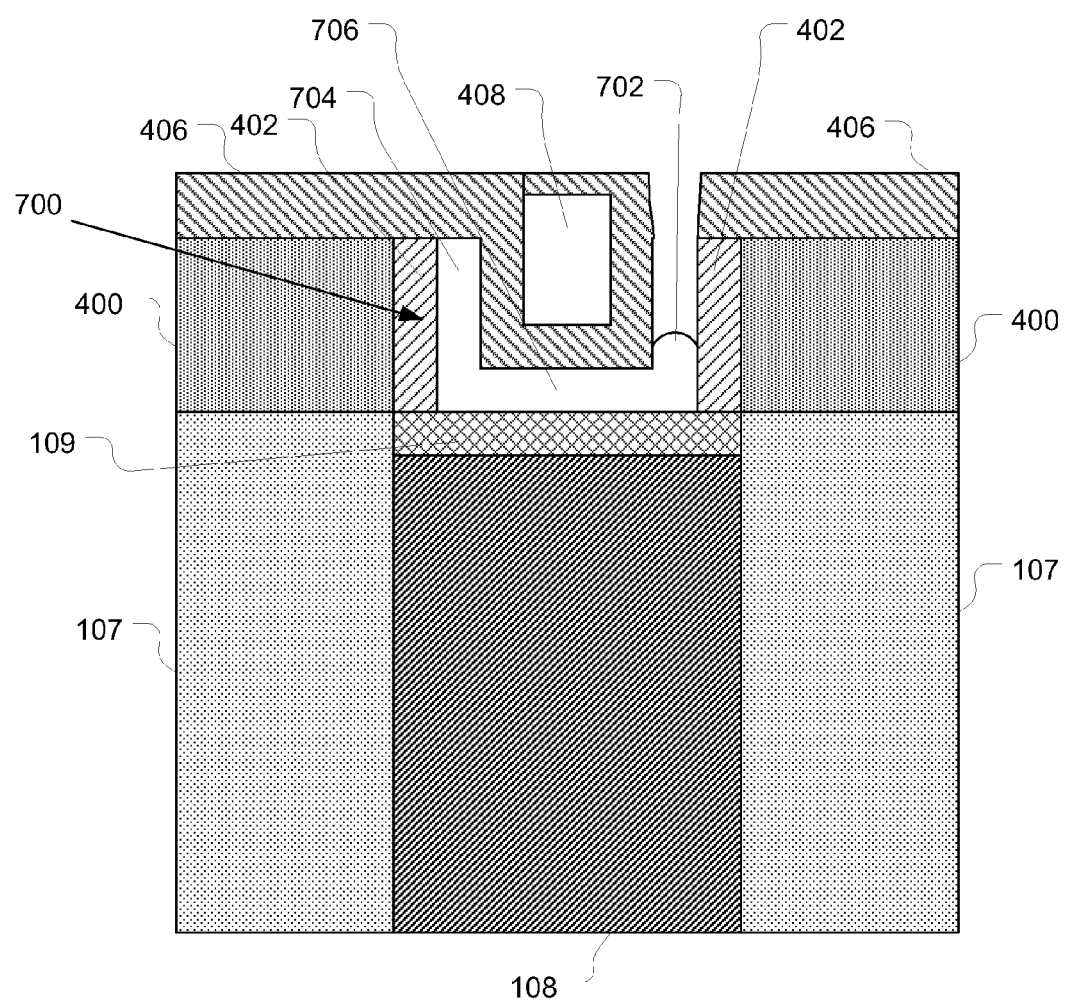
FIGS. 7 and 8 are cross sectional schematic views of the substrate after the lithographic operations of FIGS. 5 and 6, as seen along the line A-A' of FIG. 6, in accordance with various embodiments of the present invention.

Referring to FIGS. 6 and 7, in accordance with various embodiments, a lithographic operation 600 is performed across the wafer 300 in a word line direction W in order to complete formation of heater elements 700. As may be seen in FIG. 6, this operation is performed "offset" with respect to the emitters. Thus, a first portion or leg 702 of heater alloy layer is etched such that it is shorter than a second protion or leg 704. Ideally, the leg 702 will be etched such that it is substantially flush with a bottom portion 706 of the heater alloy layer 704. FIG. 7 is a cross sectional view of emitter 302 as seen along the line A-A'.

Figure 8:
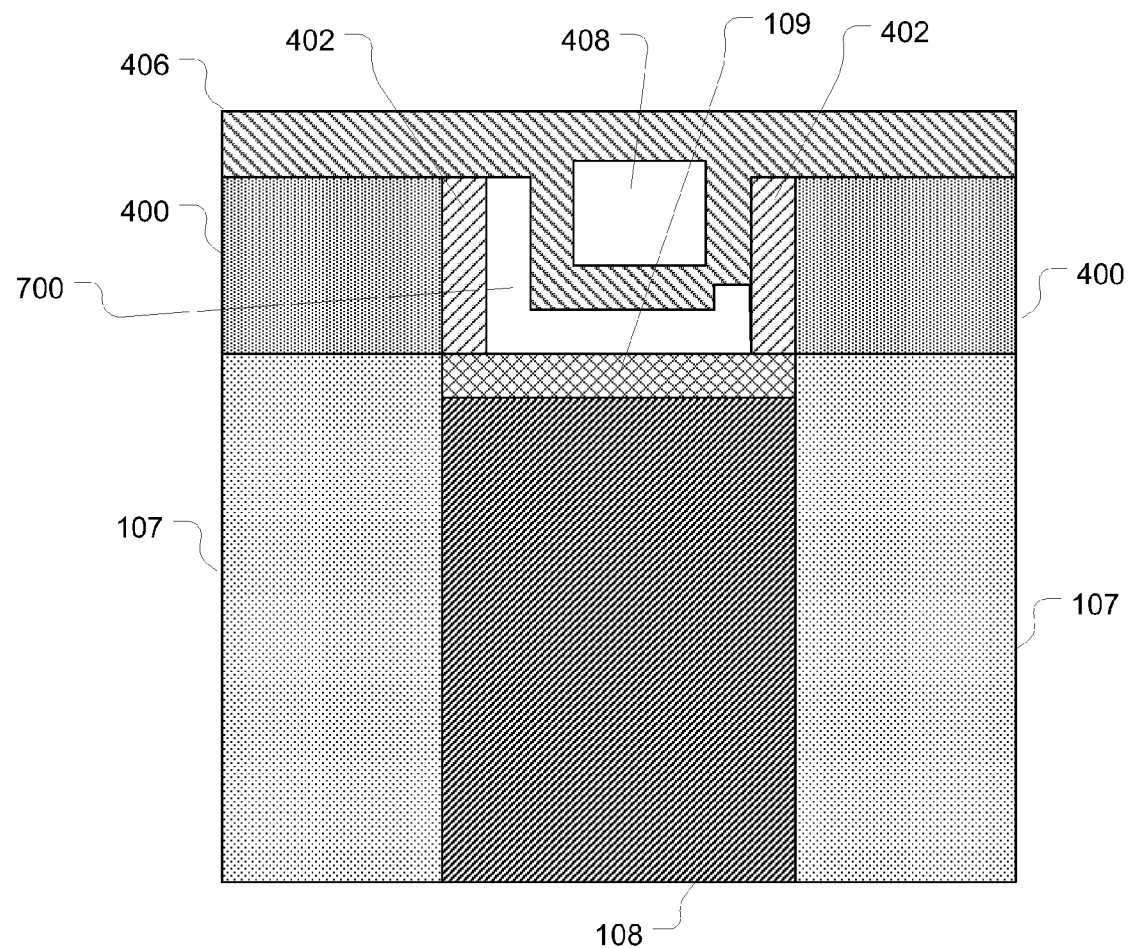

Referring to FIG. 8, a layer 802 of $Si_3N_4$ may now be deposited in order to replace the removed portion of heater alloy layer 404 and any portions of $Si_3N_4$ 406 and the $Si_3N_4$ heater seal 402 that were removed. A CMP process may then be performed in order to smooth layer 802.

Figure 9:
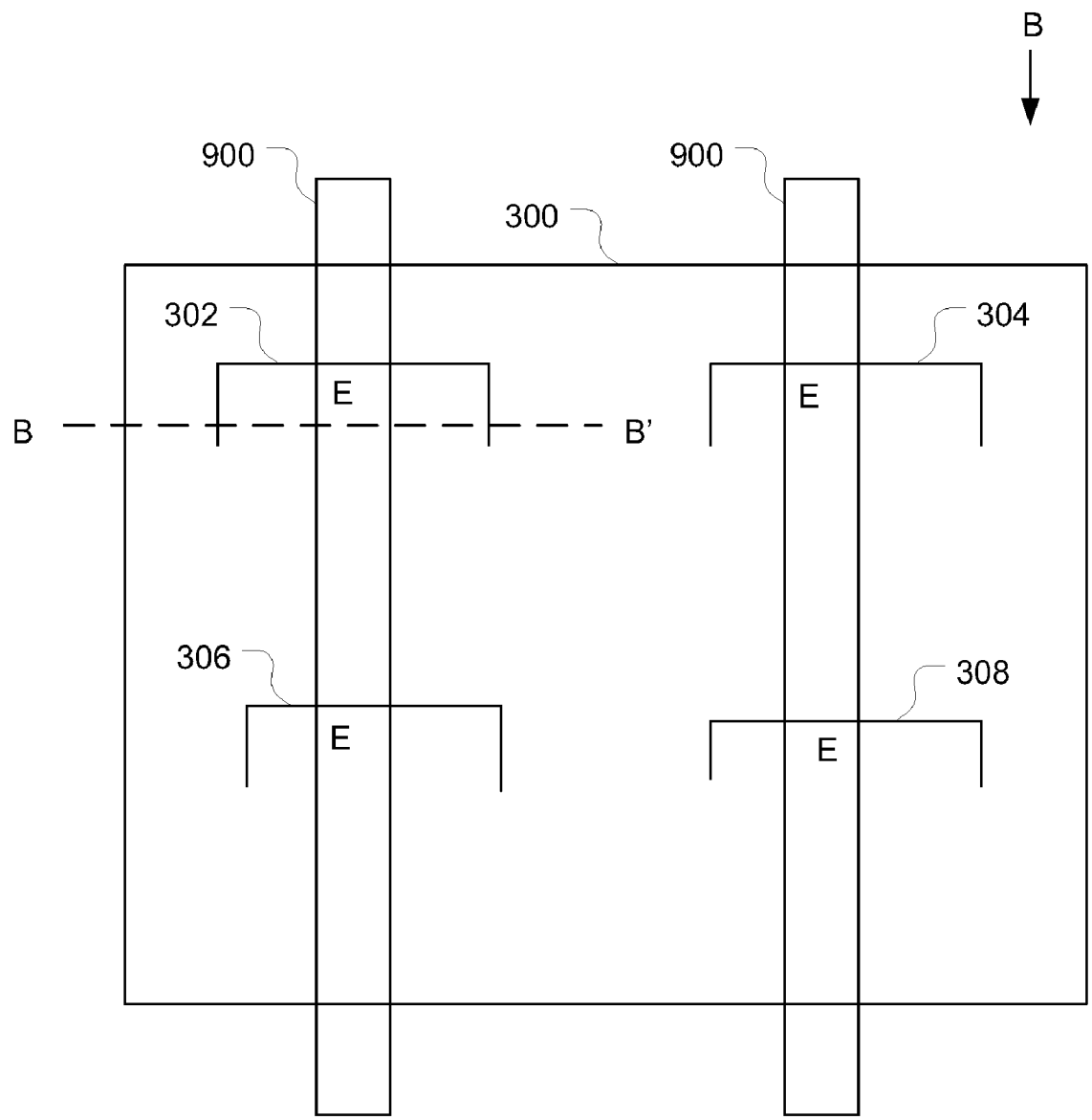
FIG. 9 is a top schematic view of the substrate illustrating a lithographic operation, in accordance with various embodiments of the present invention.
Figure 10:
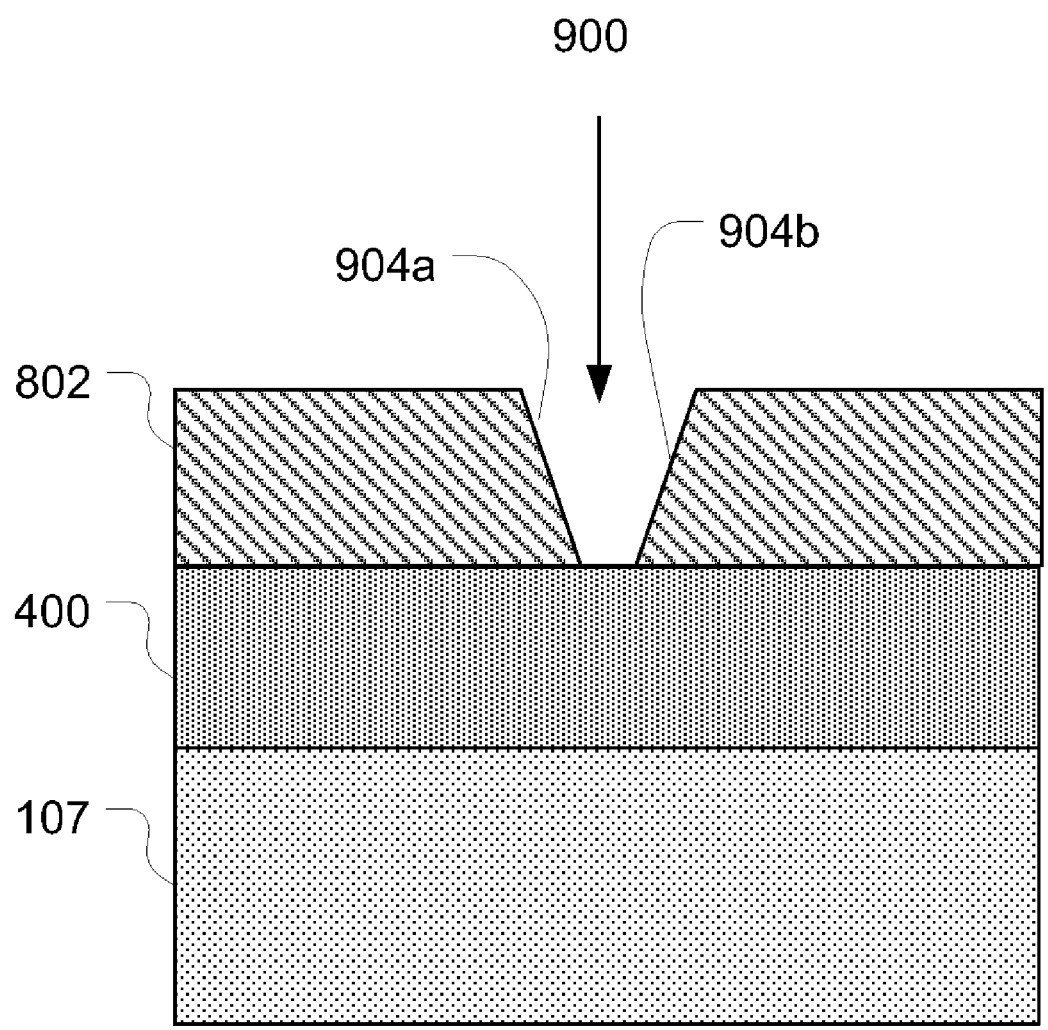
FIGS. 10 and 11 are cross sectional schematic views of the substrate after the lithographic operation of FIG. 9, as seen along the line B-B' of FIG. 9, in accordance with various embodiments of the present invention.
Figure 11:
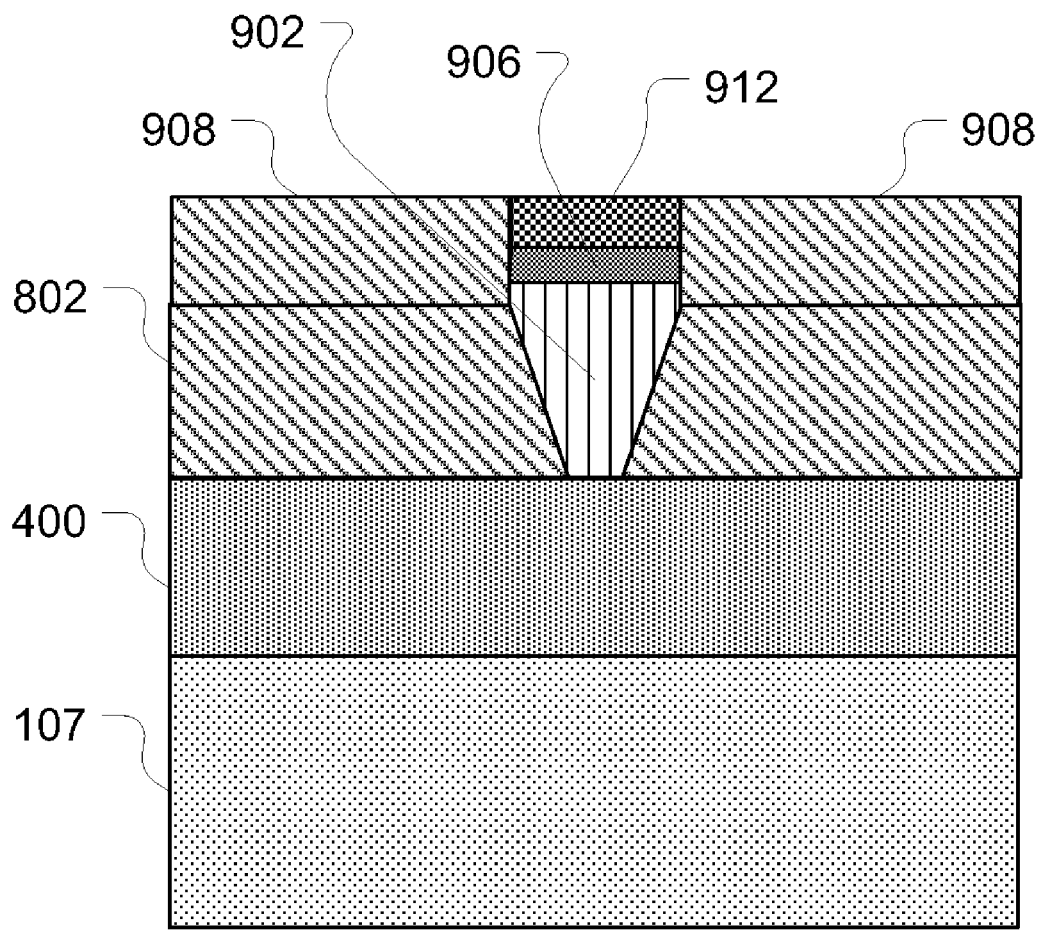
Figure 12:
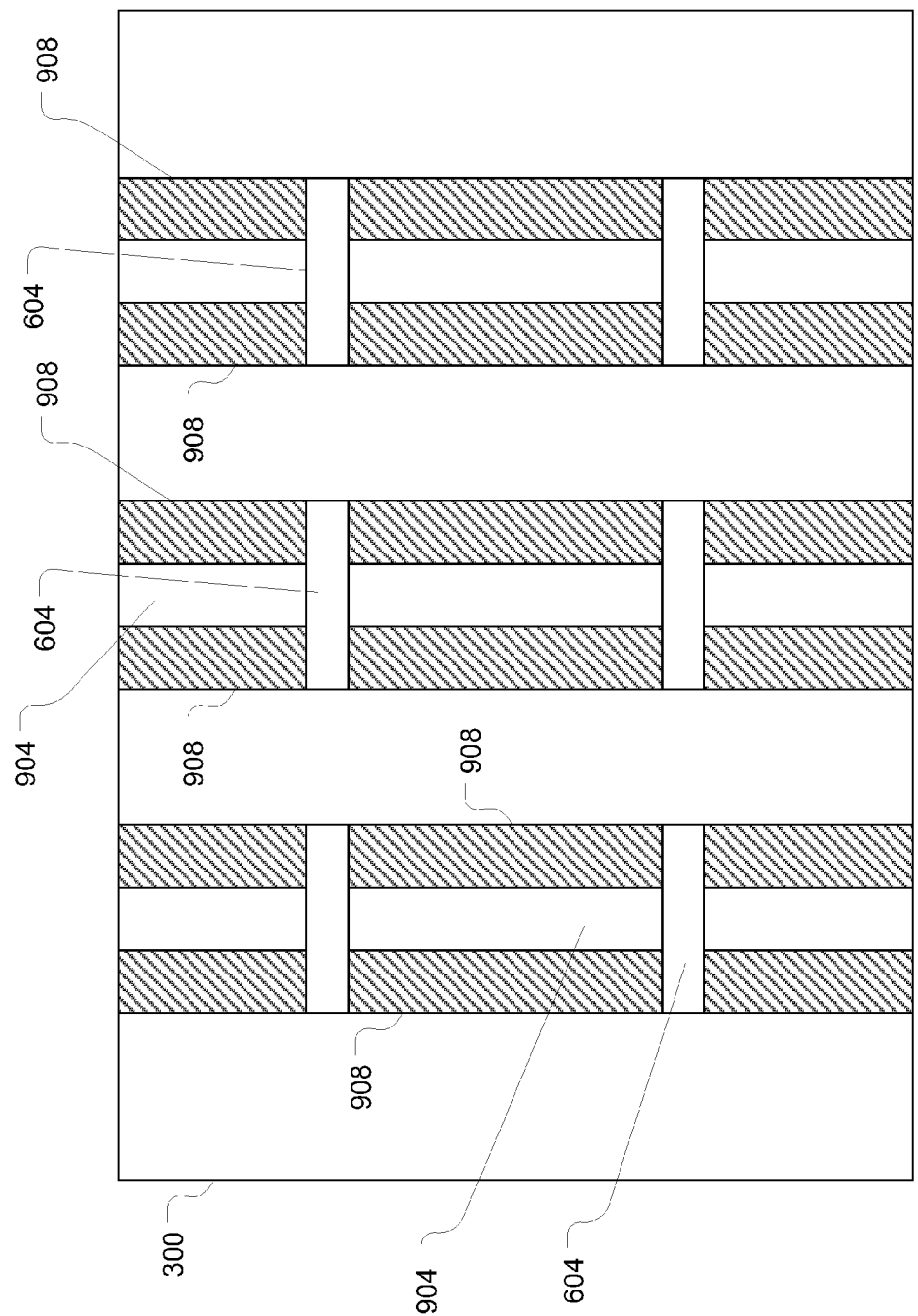
FIG. 12 a top schematic view of the substrate after at least some of the lithographic operation of FIG. 9, in accordance with various embodiments of the present invention.

In accordance with various embodiments, referring to FIGS. 9, 10 and 11, a lithographic operation 900 in the bit line direction B may be performed on the layer 802 of Si$_3$N$_4$ in order to expose the leg 604 for contact with germanium antimony tellurium (GST) portion 902, which will serve as a memory cell. In accordance with the various embodiments, the operation is performed in order to create a micro trench 904 having a reasonable slope on the sides of the trenches 904a, 904b of approximately 30 to 40 degrees relative to a vertical line. FIGS. 10 and 11 are cross sectional views of emitter 302 as seen along the line B-B'.

As may be seen in FIG. 10, the resulting exposure of the leg 604 of heating element 700 within micro trench 904 is relatively small. Thus, contact of heating element 700 with GST material 902 will be small.

Referring again to FIG. 11, GST material 902 may then be deposited within the micro trenches. If the surface of the GST material 902 is not flat, a CMP operation may be performed. A top electrode 906 may then deposited for the GST material 902. Examples of material for the top electrode include Ti, Ta, TiN and TaN. Finally, a lithograph and etching operation is performed for the GST material 902 and top electrode 906 within the micro trenches. In accordance with the various embodiments, a thin layer of Si$_3$N$_4$ is deposited and then etched in order to provide a GST seal 908. A deposition of oxide 910 is provided in order to provide over-GST dielectric. If the surface of oxide 910 is not as flat as desired, a CMP operation may be performed. A lithographic and etching operation is performed in order to provide the top emitter contact 912 on the GST material 902. In accordance with various embodiments, this operation is a metallization and the top contacts are formed from Tungsten.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments illustrated and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. An apparatus comprising:
   a substrate comprising an emitter layer including at least one emitter within the emitter layer; and
   a heater element adjacent each emitter and having a substantially squared U-shape, wherein first portion of the U-shape is shorter than a second portion of the U-shape.

2. The apparatus of claim 1, wherein the first portion is substantially flush with a bottom portion of the substantially squared U-shape.

3. The apparatus of claim 1, wherein each heater element comprises one of TiN or TaN.

4. The apparatus of claim 3, further comprising a memory cell adjacent the second portion.

5. The apparatus of claim 4, further comprising a top emitter interface on the memory cell.

6. The apparatus of claim 5, wherein a top surface of the top emitter interface comprises tungsten.

7. The apparatus of claim 6, wherein the memory cell comprises GST.

* * * * *